United States Patent
Cox et al.

(10) Patent No.: US 10,031,563 B2
(45) Date of Patent: Jul. 24, 2018

(54) TOOL-LESS AND REUSABLE HEAT SPREADER

(71) Applicant: INTERNATIONAL BUSINESS MACHINES CORPORATION, Armonk, NY (US)

(72) Inventors: Aaron R. Cox, Tucson, AZ (US); ZhenDe Fu, Shanghai (CN); Lei R. Li, Shanghai (CN); Jason E. Minyard, Phoenix, AZ (US)

(73) Assignee: INTERNATIONAL BUSINESS MACHINES CORPORATION, Armonk, NY (US)

(*) Notice: Subject to any disclaimer, the term of this patent is extended or adjusted under 35 U.S.C. 154(b) by 111 days.

(21) Appl. No.: 14/829,208

(22) Filed: Aug. 18, 2015

(65) Prior Publication Data
US 2017/0052573 A1    Feb. 23, 2017

(51) Int. Cl.
| | |
|---|---|
| *G06F 1/20* | (2006.01) |
| *H05K 7/20* | (2006.01) |
| *H01L 23/367* | (2006.01) |
| *H01L 23/40* | (2006.01) |
| *G06F 1/18* | (2006.01) |
| *H01L 21/48* | (2006.01) |
| *H01L 23/373* | (2006.01) |

(52) U.S. Cl.
CPC ............... *G06F 1/20* (2013.01); *G06F 1/183* (2013.01); *H01L 21/4882* (2013.01); *H01L 23/367* (2013.01); *H01L 23/40* (2013.01); *H05K 7/20418* (2013.01); *H01L 23/3737* (2013.01); *H01L 23/4006* (2013.01); *H01L 2023/4068* (2013.01)

(58) Field of Classification Search
CPC ... H01L 23/367; H01L 23/40; H01L 23/4068; H01L 23/4093; H01L 2023/4068; G06F 1/20; H05K 7/20418
USPC ........ 361/737, 756, 759, 807–810, 816, 818
See application file for complete search history.

(56) References Cited

U.S. PATENT DOCUMENTS

| | | | |
|---|---|---|---|
| 4,959,892 A | 10/1990 | Wang | |
| 5,886,872 A * | 3/1999 | Koenen | ..................... G06F 1/20 |
| | | | 165/80.3 |
| 6,025,992 A | 2/2000 | Dodge et al. | |
| 6,649,108 B2 | 11/2003 | McCullough et al. | |

(Continued)

FOREIGN PATENT DOCUMENTS

| | | |
|---|---|---|
| CN | 201199520 Y | 2/2009 |
| CN | 103176571 A | 6/2013 |
| JP | 2004079949 A | 3/2004 |

OTHER PUBLICATIONS

Cutt et al., "Clip-On Heat Sink for Memory Single In-Line Memory Module", Feb. 1, 1990, IP.com No. 000099837, IBM Technical Disclosure Bulletin vol. 32 No. 9B, Feb. 1990, IP.com Electronic Publication: Mar. 15, 2005.

*Primary Examiner* — Frantz Jules
*Assistant Examiner* — Lionel Nouketcha
(74) *Attorney, Agent, or Firm* — Griffiths & Seaton PLLC

(57) ABSTRACT

A tool-less heat spreader for dissipating heat produced by an electrical computing component includes a first section having a flexible thermal interface material for engaging either side of the electrical computing component; and a rigid heat shield pivotally connected to the first section, the rigid heat shield pivoting between one of a first position and a second position.

15 Claims, 8 Drawing Sheets

(56) References Cited

U.S. PATENT DOCUMENTS

| | | | |
|---|---|---|---|
| 7,391,613 B2* | 6/2008 | Lai | H01L 23/3672 165/104.26 |
| 7,429,788 B2 | 9/2008 | Clayton et al. | |
| 7,612,446 B2 | 11/2009 | Dang et al. | |
| 7,626,259 B2 | 12/2009 | Wehrly, Jr. et al. | |
| 7,626,823 B2* | 12/2009 | Yang | H01L 23/4093 257/718 |
| 7,944,702 B2* | 5/2011 | Ni | G06K 19/07732 361/737 |
| 8,076,772 B2 | 12/2011 | Hwang et al. | |
| 8,081,474 B1* | 12/2011 | Zohni | H01L 23/367 257/719 |
| 8,134,834 B2* | 3/2012 | Meyer, IV | F28D 15/0233 165/104.26 |
| 8,154,873 B2* | 4/2012 | Lian | G06F 1/20 257/707 |
| 8,638,559 B2* | 1/2014 | Barina | H01L 23/4093 165/104.21 |
| 8,705,240 B1 | 4/2014 | Zohni et al. | |
| 2004/0037044 A1* | 2/2004 | Cook | H01L 23/3677 361/719 |
| 2004/0250989 A1 | 12/2004 | Im et al. | |
| 2008/0062652 A1 | 3/2008 | Lieberman et al. | |
| 2008/0089034 A1* | 4/2008 | Hoss | G06F 1/20 361/721 |
| 2008/0276099 A1* | 11/2008 | Nguyen | G06F 12/1416 713/186 |
| 2009/0034183 A1 | 2/2009 | Chen | |
| 2009/0103269 A1* | 4/2009 | Liu | G06F 1/20 361/719 |
| 2009/0109613 A1* | 4/2009 | Legen | G06F 1/20 361/679.54 |
| 2009/0129026 A1* | 5/2009 | Baek | H01L 23/3672 361/710 |
| 2009/0257197 A1 | 10/2009 | Yang et al. | |
| 2013/0186595 A1 | 7/2013 | Hsieh | |
| 2014/0235080 A1 | 8/2014 | Cox et al. | |

* cited by examiner

US 10,031,563 B2

TOOL-LESS AND REUSABLE HEAT SPREADER

BACKGROUND OF THE INVENTION

Field of the Invention

This disclosure relates in general to computing systems, and more particularly, a heat spreader apparatus for the dissipation of heat generated by the components therein.

Description of the Related Art

In today's society, computer systems are commonplace. Computer systems may be found in the workplace, at home, or at school. As integrated circuits (e.g., central processing units (CPUs) in a computer system) become denser and more complex, components inside an integrated circuit chip are drawing more power and thus generating more heat. Various cooling systems have been used to dissipate heat generated by integrated circuit chips such as memory modules, for example within personal computers, mobile computers, or similar electrical devices.

Memory module heat spreaders (heat sinks) are commonly used to increase Dual-Inline Memory Module (DIMM) cooling efficiency. Heat sinks may be purchased as stand-alone kits to be installed by users, or they may come pre-attached to memory modules and purchased as an assembly.

SUMMARY OF THE DESCRIBED EMBODIMENTS

A tool-less heat spreader for dissipating heat produced by an electrical computing component includes a first section having a flexible thermal interface material for engaging either side of the electrical computing component; and a rigid heat shield pivotally connected to the first section, the rigid heat shield pivoting between one of a first position and a second position.

In addition to the foregoing exemplary embodiment, various other system and computer program product embodiments are provided and supply related advantages. The foregoing summary has been provided to introduce a selection of concepts in a simplified form that are further described below in the Detailed Description. This Summary is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

In order that the advantages of the invention will be readily understood, a more particular description of the invention briefly described above will be rendered by reference to specific embodiments that are illustrated in the appended drawings. Understanding that these drawings depict embodiments of the invention and are not therefore to be considered to be limiting of its scope, the invention will be described and explained with additional specificity and detail through the use of the accompanying drawings, in which.

DETAILED DESCRIPTION OF THE DRAWINGS

The following detailed description of the invention merely provides exemplary embodiments and is not intended to limit the invention of the application and uses of the invention. Furthermore, there is no intention to be bound by any theory presented in the preceding background of the invention of the following detailed description of the invention.

Reference in the specification to "one embodiment" or "an embodiment" of the present invention means that a particular feature, structure or characteristic described in connection with the embodiment is included in at least one embodiment of the present invention. Thus, the appearances of the phrase "in one embodiment" appearing in various places throughout the specification are not necessarily all referring to the same embodiment.

As aforementioned, as integrated circuits (e.g., central processing units (CPUs) in a computer system) become denser and more complex, components inside an integrated circuit chip are drawing more power and thus generating more heat. Various cooling systems have been used to dissipate heat generated by integrated circuit chips such as memory modules, for example within personal computers, mobile computers, or similar electrical devices. Memory module heat spreaders (heat sinks) are commonly used to increase Dual-Inline Memory Module (DIMM) cooling efficiency. Heat sinks may be sold as stand alone kits to be installed by users, or they may come pre-attached to memory modules and purchased as an assembly. When purchased as stand alone kits, heat sinks often contain numerous parts and small screws that are cumbersome and require tools to install and remove.

Accordingly, the present invention, in one embodiment, provides a molded flexible thermal interface material that is formed such that it may be slid over the top of an electronic computing component (e.g. DIMM). A pivotally connected rigid heat shield allows the shield to rotate over the thermal interface material and on top of the DIMM, thus compressing the thermal interface material onto the DIMM as it is closed.

The mechanisms of the present invention provide for a tool-less installation/removal of the heat spreader to the DIMM, and without the need for any small or loose parts which may be easily displaced. The heat spreader taught infra is a user-friendly solution in which simple rotation of an overriding heat shield compresses and fixes the cooling assembly together onto the DIMM. Additionally, the heat spreader taught herein is reusable, allowing for replacement of DIMMs without needing to replace the cooling system affixed thereon.

Figure 1:
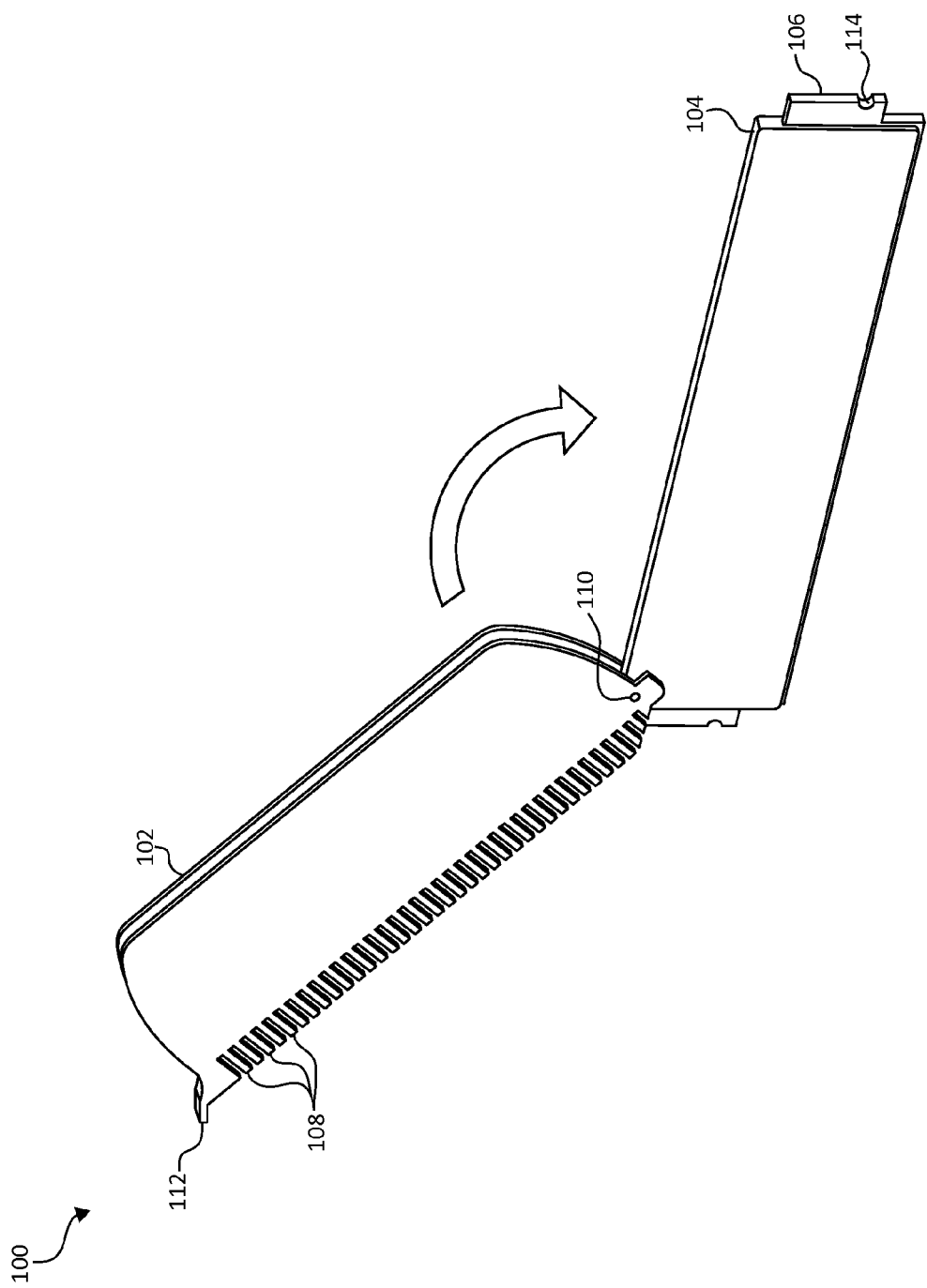
FIG. 1 illustrates a perspective view of a heat spreader according to aspects of the present invention.

Turning now to FIG. 1, a perspective view of a heat spreader assembly 100 according to one embodiment of the present invention, and is shown in an "open" position. Illustrated is a flexible thermal interface material 104, positioned atop a DIMM 106, the DIMM 106 having a pair of notches 114 to accept a releasable lock clip connector for interface with a DIMM socket. A rigid heat shield 102 is pivotally connected to the thermal interface material 104 with a pivot connector 110. The rigid heat shield 102 has formed a plurality of heat fins 108 for heat dissipation and a finger grip 112 to aid in rotating the rigid heat shield 102 to engage and compress or release the thermal interface material 104.

The thermal interface material 104 is formed of two parallel surfaces connected at an upper end for placement atop of the electronic computing component (e.g. DIMM). The thermal interface material 104 is formed to be substantially the same width and height as the DIMM 106, while providing room on either side and bottom of the DIMM 106 for coupling with a DIMM socket. This provides for substantially close thermal engagement between the top surface of the DIMM 106 and the thermal interface material 104. The close thermal engagement helps improve heat transferring efficiency from the surface of the corresponding electronic computing component to the thermal interface material 104, which is thermally conductive. The thermal interface material 104 may be constructed substantially of materials such as paraffin wax, a silicone base, a combination of such, or any other thermally conductive material commonly known in the art.

The rigid heat shield 102 is formed of two parallel surfaces connected at an upper end for placement atop of the thermal interface material 104. The rigid heat shield 102 is formed to be slightly larger in width than that of the thermal interface material 104, such that when pivotally rotated atop of the thermal interface material 104, the thermal interface material 104 is compressed by the rigid heat shield 102 to provide thermal engagement to the surface of either side of the DIMM 106. The rigid heat shield 102 may be constructed substantially of materials such as aluminum, copper, a combination of such, or any other thermally conductive material commonly known in the art. The thermal interface material 104 and the rigid heat shield 102 may be adjusted for a height and width corresponding to various sizes of electronic computing components.

At an upper surface of the rigid heat shield 102, formed are the plurality of heat fins 108. The number, width, and height of the heat fins 108 may vary according to the specific implementation. The heat fins 108 provide an additional notched surface for which to dissipate heat through increased airflow. Formed also at an upper surface of the rigid heat shield 102 is the finger grip 112 to aid in pivotal rotation of the rigid heat shield 102 in order to engage and compress the thermal interface material 104. The finger grip 112 is positioned opposite the pivot connector 110. The pivot connector 110 pivotally connects the rigid heat shield 102 to the thermal interface material 104 at one end and may use a pin, screw, rivet, compression fit, a combination thereof, or any other device suitable for a pivotal connection commonly known in the art.

Figure 2:
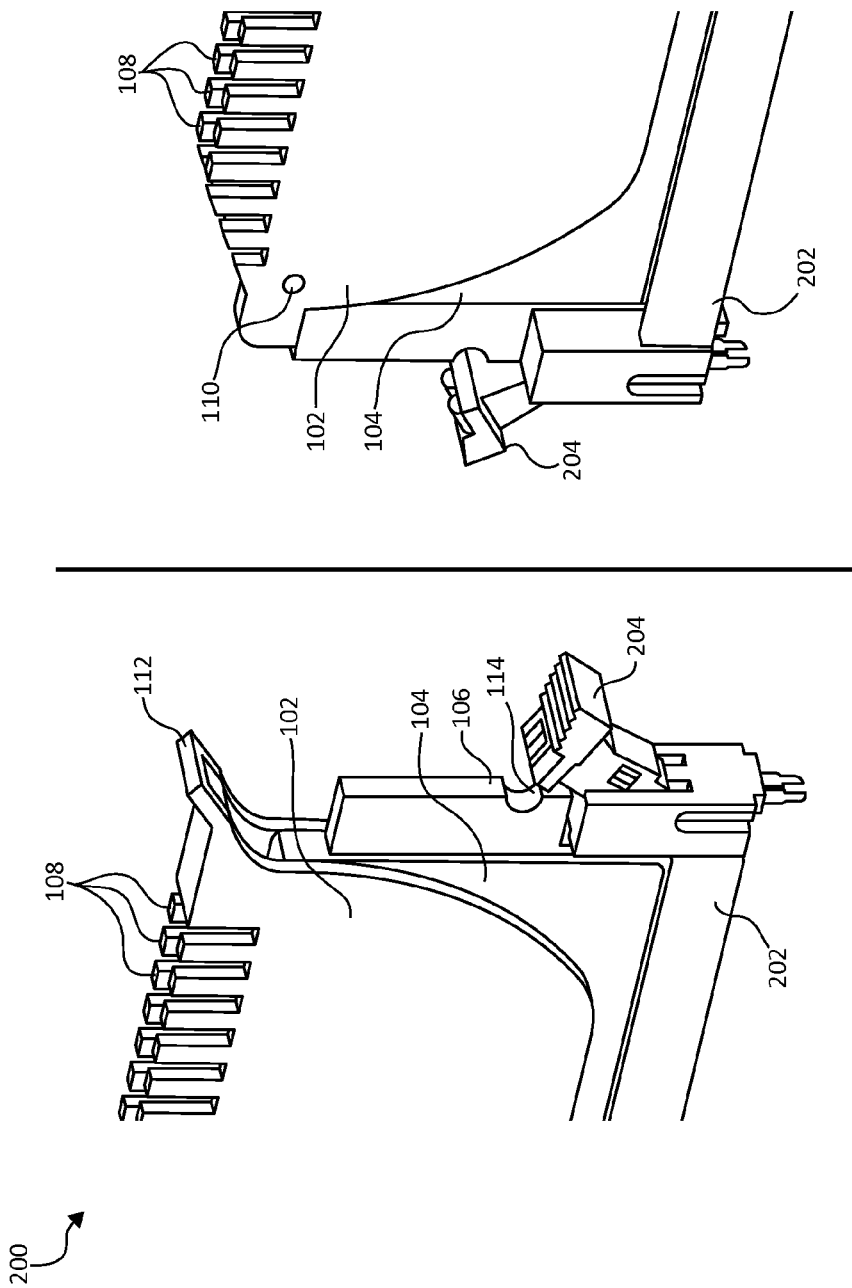
FIG. 2 illustrates an enlarged view of a heat spreader according to aspects of the present invention.

FIG. 2 illustrates an enlarged view of a heat spreader assembly 200 in a "closed" position, according to one embodiment of the present invention. Illustrated is the flexible thermal interface material 104, positioned atop the DIMM 106, the DIMM 106 having notches 114 to accept a releasable lock clip connector 204 for interface with a DIMM socket 202. The rigid heat shield 102 is pivotally connected to the thermal interface material 104 with pivot connector 110. The rigid heat shield 102 has formed the plurality of heat fins 108 for heat dissipation and the finger grip 112 to aid in rotating the rigid heat shield 102 to engage and compress or release the thermal interface material 104. Assembly 200 is shown to be engaged in the DIMM socket 202 using clip connectors 204 to secure the DIMM 106.

Figure 3A:
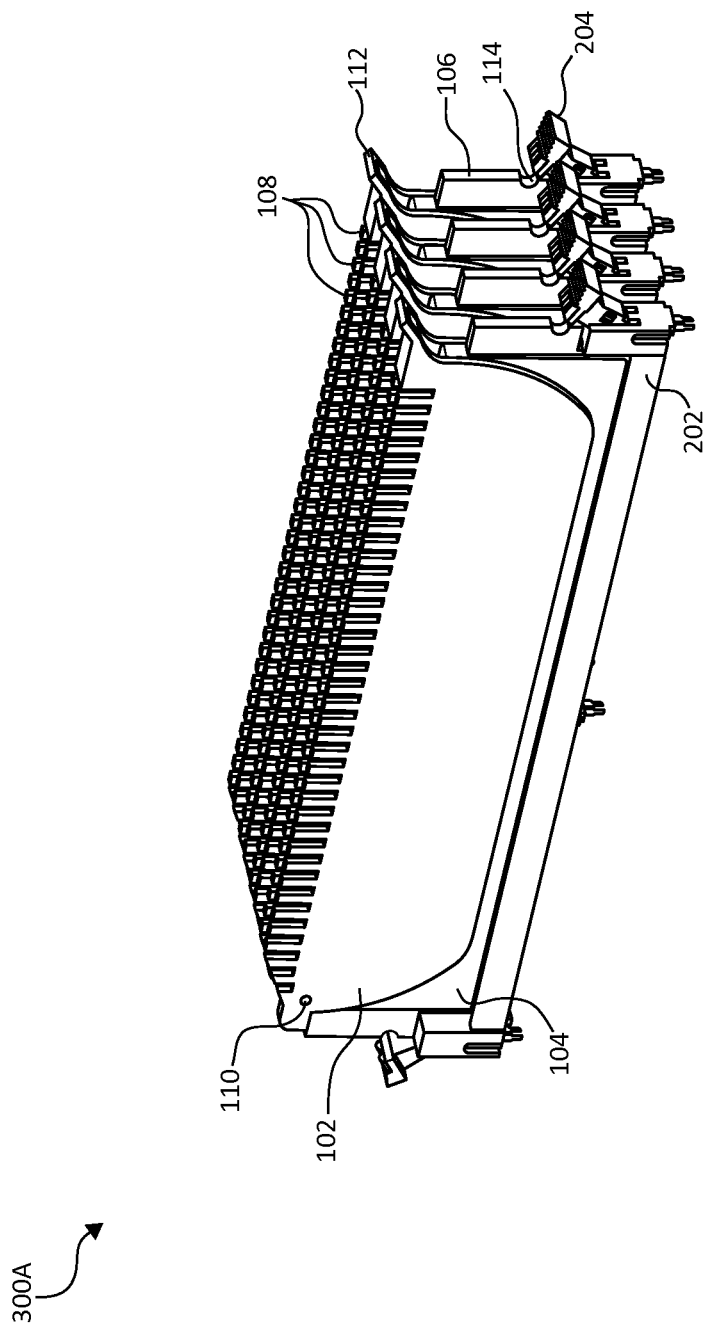
FIG. 3A illustrates a perspective view of a plurality of heat spreaders in operation, according to aspects of the present invention.

FIG. 3A illustrates a perspective view of a plurality of heat spreaders assembled in a typical use environment 300A. Illustrated are a plurality of assemblies having the flexible thermal interface material 104, positioned atop the DIMM 106, the DIMM 106 having notches 114 to accept the releasable lock clip connector 204 for interface with the DIMM socket 202. The rigid heat shield 102 is pivotally connected to the thermal interface material 104 with the pivot connector 110. The rigid heat shield 102 has formed the plurality of heat fins 108 for heat dissipation and the finger grip 112 to aid in rotating the rigid heat shield 102 to engage and compress or release the thermal interface material 104. Assembly 300A is shown to be engaged in the DIMM socket 202 using clip connectors 204 to secure the DIMM 106. Note that each heat spreader assembly has a width and height as to not interfere with the ordinary interface of multiple DIMM 106 engaged with multiple DIMM socket 202 as commonly found in computer interface environments.

Figure 3B:
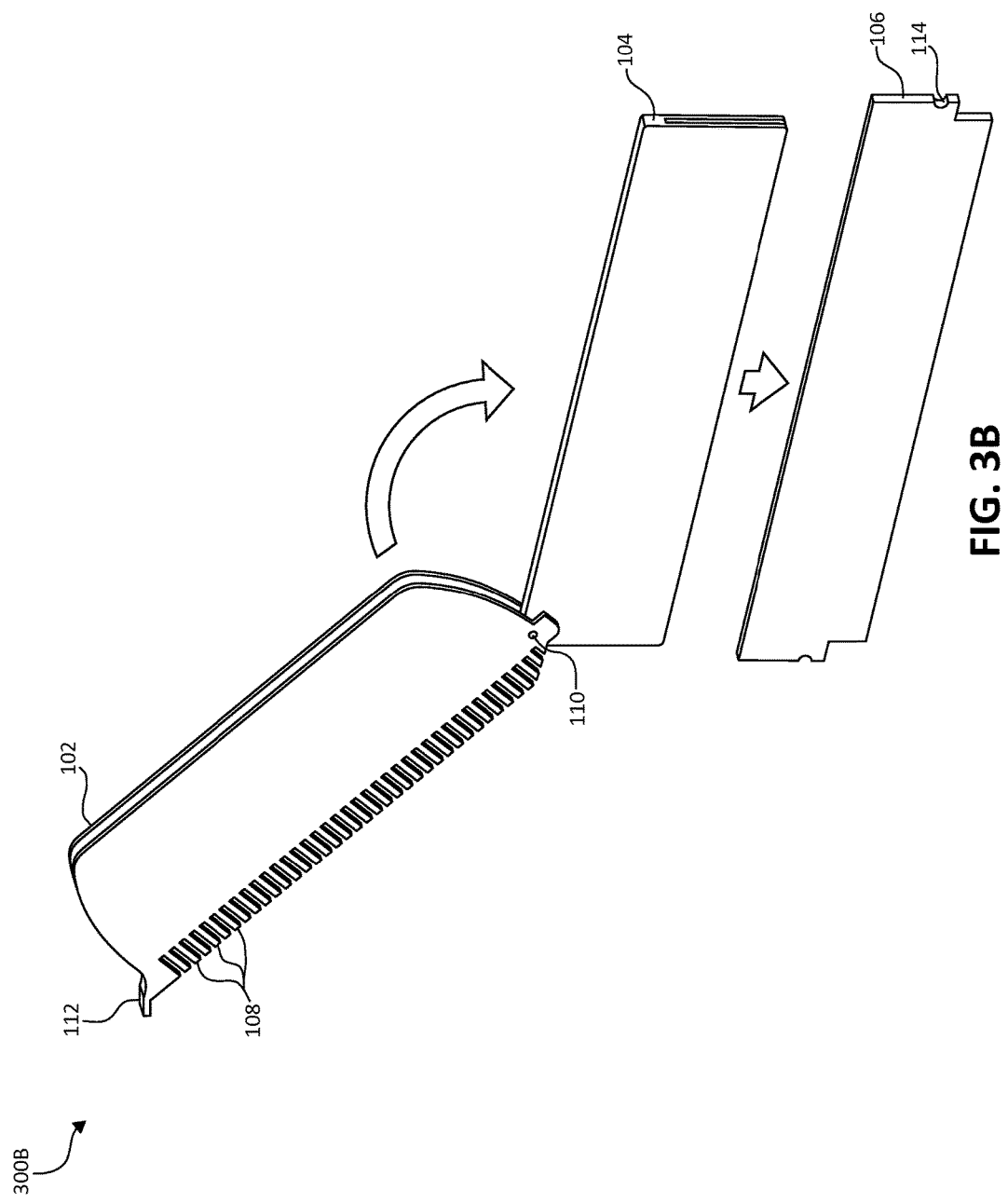
FIG. 3B illustrates a perspective view of a heat spreader and memory module according to aspects of the present invention.

FIG. 3B illustrates a perspective view of a heat spreader assembly 300B according to one embodiment of the present invention, shown in an "open" position. Illustrated is the flexible thermal interface material 104, for positioning atop the DIMM 106, the DIMM 106 having notches 114 to accept the releasable lock clip connector 204 for interface with the DIMM socket 202. The rigid heat shield 102 is pivotally connected to the thermal interface material 104 with pivot connector 110. The rigid heat shield 102 has formed the plurality of heat fins 108 for heat dissipation and the finger grip 112 to aid in rotating the rigid heat shield 102 to engage and compress or release the thermal interface material 104. Assembly 300B illustrates the positioning of the thermal interface material 104 atop the DIMM 106. The thermal interface material 104 is notched to accept the DIMM 106, while the rigid heat shield 102 pivotally connects via pivot connector 110 to engage and compress or release the thermal interface material 104.

Figure 4:
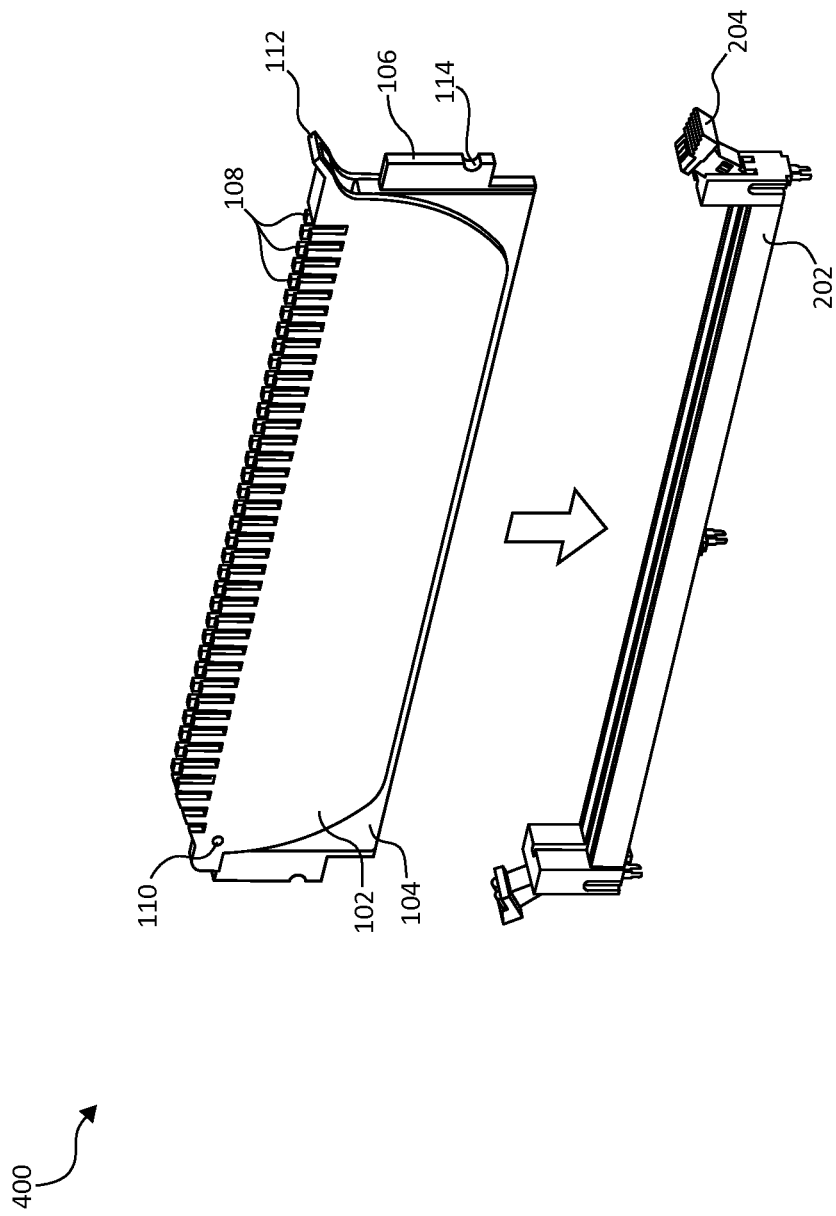
FIG. 4 illustrates a perspective view of a heat spreader and memory module according to aspects of the present invention.

FIG. 4 illustrates a perspective view of a heat spreader assembly 400 according to one embodiment of the present invention, shown interfacing with the DIMM socket 202. Illustrated is the flexible thermal interface material 104, positioned atop the DIMM 106, the DIMM 106 having notches 114 to accept the releasable lock clip connector 204 for interface with the DIMM socket 202. The pivotally connected rigid heat shield 102 is connected to the thermal interface material 104 with pivot connector 110. The rigid heat shield 102 has formed the plurality of heat fins 108 for heat dissipation and the finger grip 112 to aid in rotating the rigid heat shield 102 to engage and compress or release the thermal interface material 104. Assembly 400 illustrates the positioning of the heat spreader assembly in relation to interfacing with the DIMM socket 202.

Figure 5:
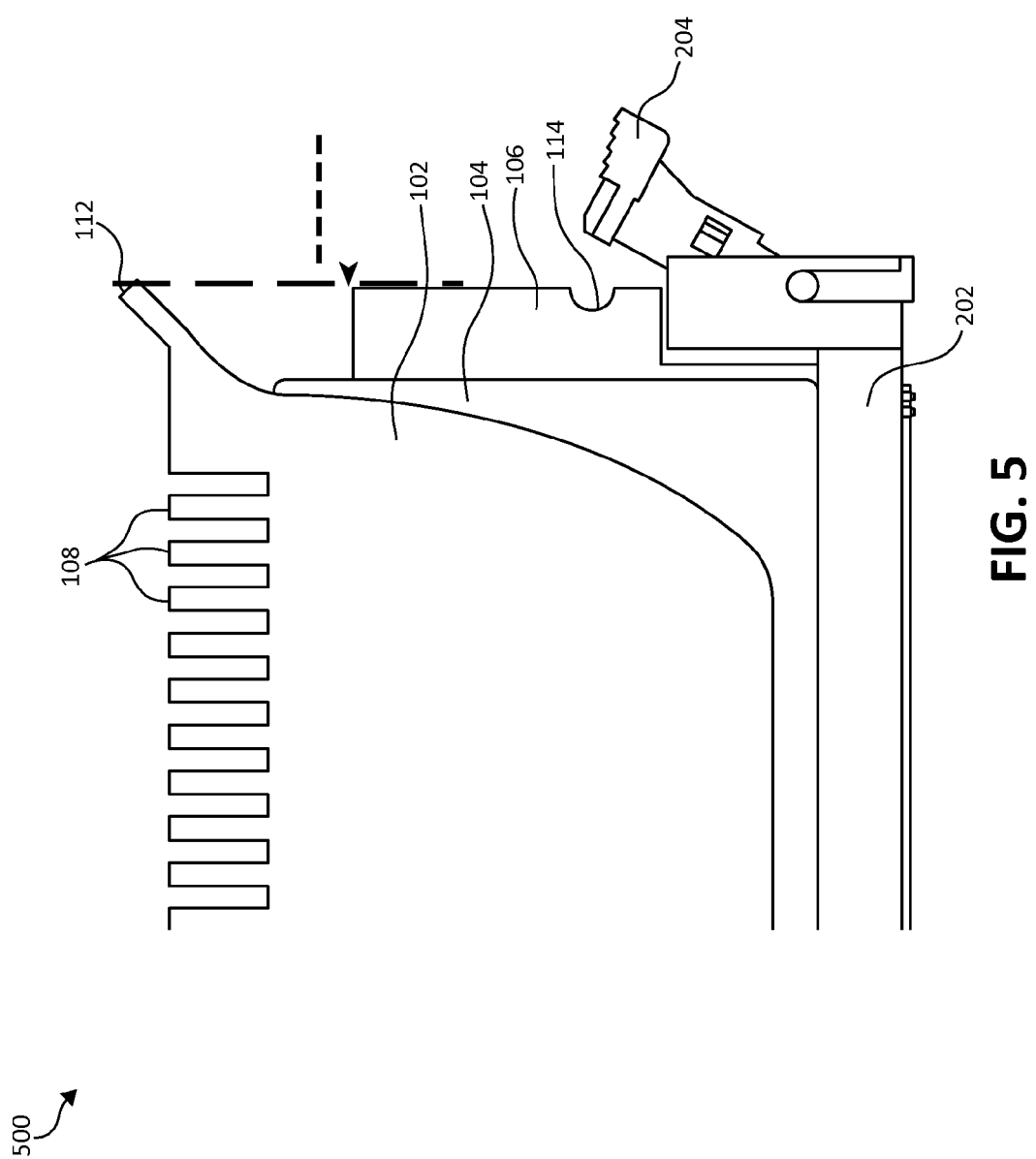
FIG. 5 illustrates an enlarged view of a heat spreader and memory module according to aspects of the present invention.

FIG. 5 illustrates an enlarged view of a heat spreader assembly 500 according to one embodiment of the present invention. Shown is is DIMM 106 connected to the DIMM socket 202, using clip connectors 204 to secure. The thermal interface material 104 is positioned over the DIMM 106, and compressed by the rigid heat shield 102. The rigid heat shield has formed at the upper end heat fins 108, and the finger grip 112. Note that the finger grip 112 is formed such that it does not extend laterally beyond that of the edge of the DIMM 106, as to not interfere with any connecting or surrounding equipment.

Figure 6:
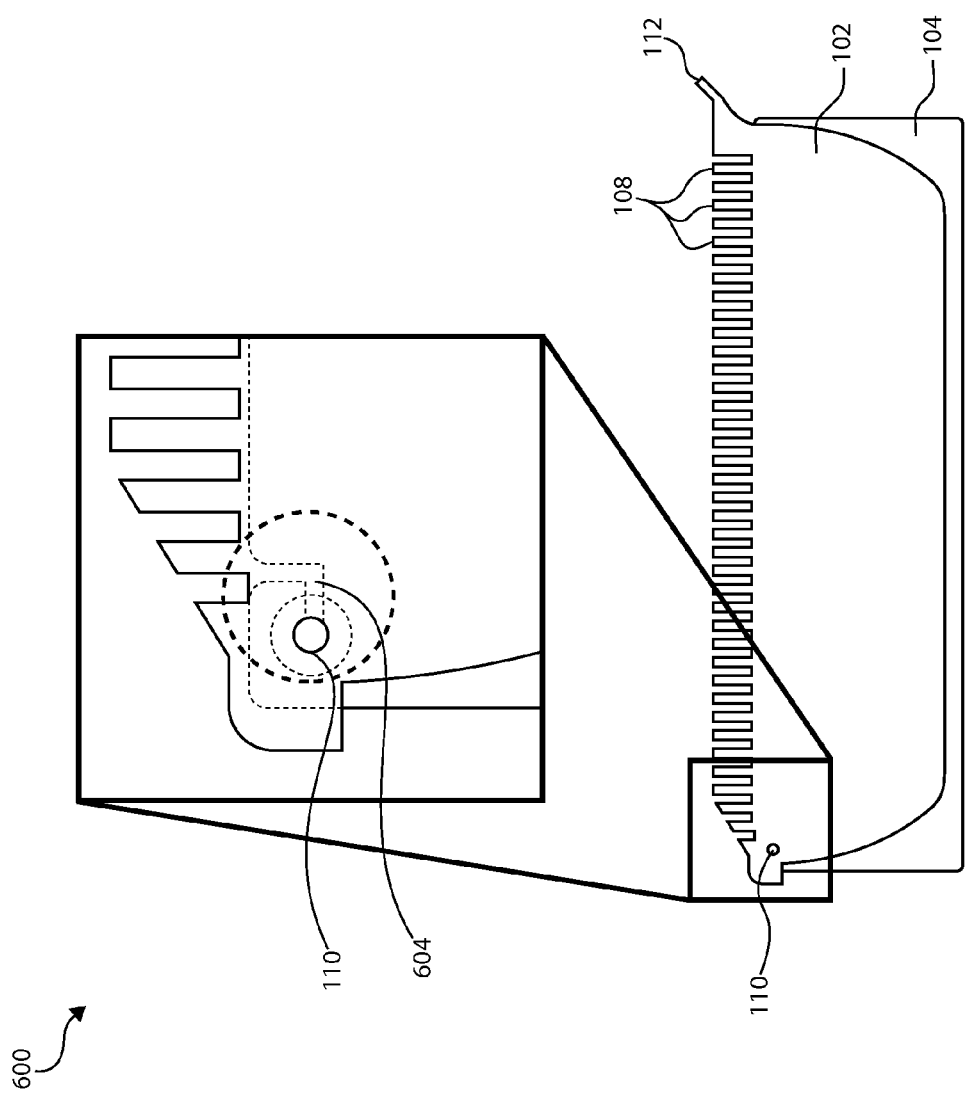
FIG. 6 illustrates a perspective view of a heat spreader and memory module according to aspects of the present invention.

FIG. 6 illustrates a perspective view of a heat spreader assembly 600 according to an alternative embodiment of the present invention. Illustrated is thermal interface material 104 positioned under the rigid heat shield 102. The rigid heat shield having a finger grip 112 and a plurality of heat fins 108 for increased heat dissipation. The rigid heat shield 102 is pivotally connected to the thermal interface material 104 using pivot connector 110. In this example, however, pivot connector 110 is placed in a keyed geometry notch 604 to allow for separation and disassembly of the thermal interface material 104 from the rigid heat shield 102. This allows the thermal interface material 104 to be replaced as it loses elasticity, or to provide alternative sizes of the thermal interface material 104, or alternative sizes of the rigid heat shield 102 that may be used to accommodate different widths and sizes of DIMM 106.

Figure 7:
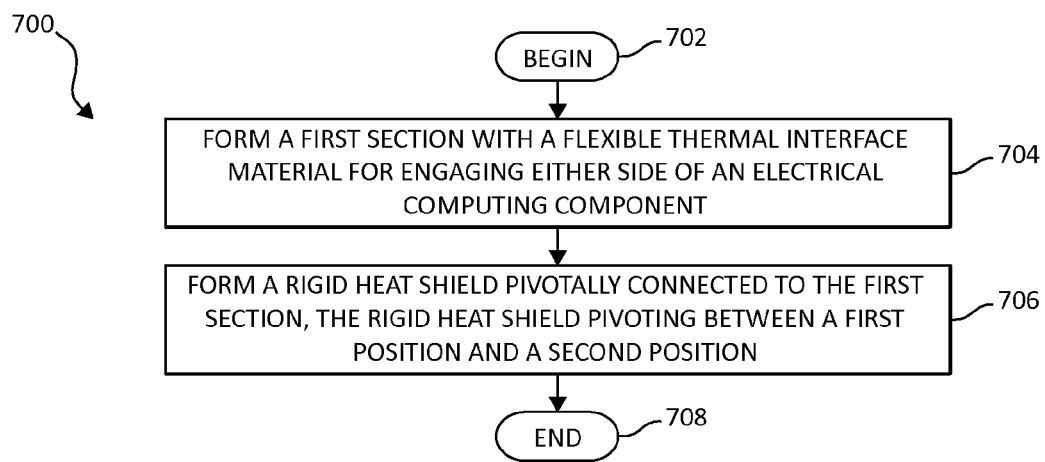
FIG. 7 illustrates a method of manufacturing a heat spreader according to aspects of the present invention.

FIG. 7 illustrates a method of manufacturing a tool-less heat spreader for dissipating heat produced by an electrical computing component 700, according to one embodiment of the present invention. Beginning at step 702, a first section having a flexible thermal interface material for engaging either side of the electrical computing component is formed (step 704). A rigid heat shield pivotally connected to the first section is then formed, the rigid heat shield pivoting between one of a first position and a second position (step 706). The method ends (step 708).

In the preceding description, various aspects of the present disclosure have been described. For purposes of explanation, specific numbers, systems and configurations were set forth in order to provide a thorough understanding of the present disclosure. However, it is apparent to one skilled in the art having the benefit of this disclosure that the present disclosure may be practiced without the specific details. In other instances, well-known features, components, or modules were omitted, simplified, combined, or split in order not to obscure the present disclosure.

While one or more embodiments of the present invention have been illustrated in detail, one of ordinary skill in the art will appreciate that modifications and adaptations to those embodiments may be made without departing from the scope of the present invention as set forth in the following claims.

What is claimed is:

1. A tool-less heat spreader for dissipating heat produced by an electrical computing component, comprising:
    a first section having a flexible thermal interface material for engaging both side of the electrical computing component; and
    a rigid heat shield pivotally connected to the first section, the rigid heat shield pivoting between one of a first position and a second position; wherein the first position is an open position and the second position is a closed position, the rigid heat shield pivoting up and away from the first section when in the open position, the rigid heat shield covering and compressing the first section onto the electrical computing component when in the closed position, wherein the rigid heat shield comprises two parallel sections, wherein the two parallel sections form a fist lateral side, wherein the first lateral side comprises a formed connection between the two parallel sections, and a plurality of fins in a middle section of the first lateral side, wherein the two parallel sections form a second lateral side, wherein the second lateral side is open and formed for sliding the rigid heat shield over the first section of the heat spreader; and
    wherein the rigid heat shield is pivotally connected to the first section of the heat spreader through an aperture in an upper surface of the two parallel sections; and wherein the first section of the heat spreader and the rigid heat shield pivotally connected thereto are freestanding and portable.

2. The heat spreader of claim 1, wherein the flexible thermal interface material comprises two parallel sections connected at an upper surface, and formed such for sliding the first section over the electrical computing component.

3. The heat spreader of claim 1, further including a pivot connector for pivotally connecting the rigid heat shield to the first section.

4. The heat spreader of claim 1, further including a finger grip formed into the upper surface of the rigid heat shield.

5. The heat spreader of claim 1, wherein the electrical computing component comprises a Dual-Inline Memory Module (DIMM).

6. A tool-less heat spreader for dissipating heat produced by an electrical computing component, comprising:
    a first section having a flexible thermal interface material formed to cover and engage surfaces of both sides of the electrical computing component; and
    a rigid heat shield pivotally connected at one end of the first section and formed to cover the first section, the rigid heat shield pivoting between one of a first position and a second position; wherein the first position is an open position and the second position is a closed position, the rigid heat shield pivoting up and away from the first section when in the open position, and covering and compressing the first section onto the electrical computing component when in the closed position; wherein the rigid heat shield comprises two parallel sections, wherein the two parallel sections form a fist lateral side, wherein the first lateral side comprises a formed connection between the two parallel sections, and a plurality of fins in a middle section of the first lateral side, wherein the two parallel sections form a second lateral side, wherein the second lateral side is open and formed for sliding the rigid heat shield over the first section of the heat spreader; and
    wherein the rigid heat shield is pivotally connected to the first section through an aperture in an upper surface of the two parallel sections; and wherein the first section of the heat spreader and the rigid heat shield pivotally connected thereto are freestanding and portable.

7. The heat spreader of claim 6, wherein the flexible thermal interface material comprises two parallel sections connected at an upper surface, and formed such for sliding the first section over the electrical computing component.

8. The heat spreader of claim 6, further including a pivot connector for pivotally connecting the rigid heat shield to the first section.

9. The heat spreader of claim 6, further including a finger grip formed into the upper surface of the rigid heat shield.

10. The heat spreader of claim 6, wherein the electrical computing component comprises a Dual-Inline Memory Module (DIMM).

11. A method of manufacturing a tool-less heat spreader for dissipating heat produced by an electrical computing component, comprising:

forming a first section having a flexible thermal interface material for engaging both side of the electrical computing component; and forming a rigid heat shield pivotally connected to the first section, the rigid heat shield pivoting between one of a first position and a second position; wherein the first position is an open position and the second position is a closed position, the rigid heat shield pivoting up and away from the first section when in the open position, the rigid heat shield covering and compressing the first section onto the electrical computing component when in the closed position; wherein the rigid heat shield comprises two parallel sections, wherein the two parallel sections form a fist lateral side, wherein the first lateral side comprises a formed connection between the two parallel sections, and a plurality of fins in a middle section of the first lateral side, wherein the two parallel sections form a second lateral side, wherein the second lateral side is open and formed for sliding the rigid heat shield over the first section of the heat spreader; and wherein the rigid heat shield is pivotally connected to the first section of the heat spreader through an aperture in an upper surface of the two parallel sections; and wherein the first section of the heat spreader and the rigid heat shield pivotally connected thereto are free-standing and portable.

12. The method of claim 11, wherein the flexible thermal interface material comprises two parallel sections connected at an upper surface, and formed such for sliding the first section over the electrical computing component.

13. The method of claim 11, further including a pivot connector for pivotally connecting the rigid heat shield to the first section.

14. The method of claim 11, further including forming a finger grip into the upper surface of the rigid heat shield.

15. The method of claim 11, wherein the electrical computing component comprises a Dual-Inline Memory Module (DIMM).

* * * * *